(12) United States Patent
Liang et al.

(10) Patent No.: US 8,846,488 B2
(45) Date of Patent: Sep. 30, 2014

(54) SEMICONDUCTOR DEVICE AND METHOD FOR MANUFACTURING THE SAME

(75) Inventors: Qingqing Liang, Lagrangeville, NY (US); Huaxiang Yin, Beijing (CN); Huicai Zhong, San Jose, CA (US); Huilong Zhu, New York, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 124 days.

(21) Appl. No.: 13/578,598

(22) PCT Filed: Nov. 30, 2011

(86) PCT No.: PCT/CN2011/001999
§ 371 (c)(1),
(2), (4) Date: Aug. 10, 2012

(87) PCT Pub. No.: WO2013/053084
PCT Pub. Date: Apr. 18, 2013

(65) Prior Publication Data
US 2013/0093041 A1    Apr. 18, 2013

(30) Foreign Application Priority Data
Oct. 14, 2011 (CN) .......................... 2011 1 0311343

(51) Int. Cl.
*H01L 21/76* (2006.01)
*H01L 29/78* (2006.01)
*H01L 21/762* (2006.01)
*H01L 21/265* (2006.01)

(52) U.S. Cl.
CPC ...... *H01L 21/76224* (2013.01); *H01L 29/7842* (2013.01); *H01L 29/7847* (2013.01); *H01L 21/26506* (2013.01)
USPC .................. 438/424; 257/506; 257/E21.134; 257/E21.546; 257/E29.006

(58) Field of Classification Search
None
See application file for complete search history.

(56) References Cited

U.S. PATENT DOCUMENTS

| | | | |
|---|---|---|---|
| 6,743,687 B1 * | 6/2004 | Yu .................................. | 438/303 |
| 6,974,981 B2 | 12/2005 | Chidambarrao et al. ..... | 257/265 |
| 8,034,724 B2 | 10/2011 | Shimomura et al. .......... | 438/769 |
| 2004/0113174 A1 | 6/2004 | Chidambarrao et al. ..... | 257/200 |
| 2005/0280051 A1 | 12/2005 | Chidambarrao et al. ..... | 257/274 |
| 2006/0027809 A1 * | 2/2006 | Ogawa et al. ................... | 257/66 |
| 2007/0190741 A1 * | 8/2007 | Lindsay ........................ | 438/424 |
| 2008/0020555 A1 | 1/2008 | Shimomura et al. .......... | 438/487 |
| 2012/0007078 A1 | 1/2012 | Shimomura et al. ............ | 257/52 |

FOREIGN PATENT DOCUMENTS

| | | | |
|---|---|---|---|
| CN | 1507032 A | 6/2004 | ............. H01L 21/76 |
| CN | 101118851 A | 6/2008 | ............. H01L 21/20 |

* cited by examiner

*Primary Examiner* — Yasser A Abdelaziez
(74) *Attorney, Agent, or Firm* — Martine Penilla Group, LLP

(57) ABSTRACT

The invention relates to a semiconductor device and a method for manufacturing such a semiconductor device. A semiconductor device according to an embodiment of the invention may comprise: a substrate; a device region located on the substrate; and at least one stress introduction region separated from the device region by an isolation structure, with stress introduced into at least a portion of the at least one stress introduction region, wherein the stress introduced into the at least a portion of the at least one stress introduction region is produced by utilizing laser to illuminate an amorphized portion comprised in the at least one stress introduction region to recrystallize the amorphized portion. The semiconductor device according to an embodiment of the invention produces stress in a simpler manner and thereby improves the performance of the device.

10 Claims, 3 Drawing Sheets

SEMICONDUCTOR DEVICE AND METHOD FOR MANUFACTURING THE SAME

CLAIM OF PRIORITY

This application is a National Phase application of, and claims priority to, PCT Application No. PCT/CN2011/001999, filed on Nov. 30, 2011, entitled "Semiconductor Device and Method for Manufacturing the Same", which claimed priority to Chinese Application No. 201110311343.6, filed on Oct. 14, 2011. Both the PCT Application and Chinese Application are incorporated herein by reference in their entireties.

FIELD OF THE INVENTION

The invention relates to a semiconductor device. The invention also relates to a method for manufacturing such a semiconductor device.

BACKGROUND OF THE INVENTION

With the development of semiconductor integrated circuits, higher requirements are raised for the performance of a semiconductor device, especially the speed of the device. In order to improve the performance of a semiconductor device, techniques have been proposed to introduce mechanical stress in the semiconductor device, e.g. in a channel of a transistor. These techniques of introducing stress comprise using a stress liner on top and embedding a semiconductor into a source/drain region.

However, these techniques of introducing stress increase the complexity of the process for manufacturing a semiconductor device, and at the same time cannot be applied in various integrated circuits due to process limitation.

SUMMARY OF THE INVENTION

An object of the invention is to overcome at least some of the above drawbacks and provide an improved semiconductor device and a method for manufacturing the same.

According to an aspect of the invention, there is provided a method for manufacturing a semiconductor device comprising providing a substrate; forming a device region and forming at least one stress introduction region separated from the device region on the substrate; forming an isolation structure between the device region and the at least one stress introduction region; amorphizing at least a portion of the at least one stress introduction region; and recrystallizing the amorphized portion of the at least one stress introduction region by laser, thereby introducing stress into the at least one stress introduction region.

In the method for manufacturing a semiconductor device, at least a portion of the at least one stress introduction region is amorphized, and laser is utilized to illuminate the amorphized portion of the at least one stress introduction region to recrystallize the amorphized portion, thereby introducing stress into the at least one stress introduction region. In other words, the invention proposes a technique of producing stress by utilizing laser to achieve a selective recrystallization. As compared to the prior art, such a technique is simpler and can be widely used in the fabrication of various integrated circuits.

According to an embodiment of the invention, the substrate may be a semiconductor substrate, and forming a device region and forming at least one stress introduction region separated from the device region on the substrate may comprise: patterning at least a portion of the upper part of the semiconductor substrate, thereby forming the device region and the at least one stress introduction region separated from the device region.

According to another embodiment of the invention, forming a device region and forming at least one stress introduction region separated from the device region on the substrate may comprise: forming a semiconductor layer on the substrate; and patterning at least a portion of the semiconductor layer, thereby forming the device region and the at least one stress introduction region separated from the device region.

According to a further embodiment of the invention, forming an isolation structure between the device region and the at least one stress introduction region may comprise: filling the spacing between the device region and the at least one stress introduction region with a dielectric.

According to a further embodiment of the invention, at least a portion of the at least one stress introduction region may be amorphized by selectively implanting ions into the at least a portion of the at least one stress introduction region.

According to a further embodiment of the invention, a cap layer at least covering the device region may be formed before at least a portion of the at least one stress introduction region is amorphized. The cap layer may for example comprise a metal layer capable of reflecting laser. The cap layer may, for example, also comprise a buffer layer below the metal layer.

According to a further embodiment of the invention, a semiconductor device structure may be formed in the device region after the device region is formed in the substrate.

According to a further embodiment of the invention, a semiconductor device structure may be formed in the device region after the isolation structure is formed between the device region and the at least one stress introduction region.

According to a further embodiment of the invention, the cap layer may be removed after the amorphized portion of the at least one stress introduction region is recrystallized and thereby stress is introduced into the at least one stress introduction region. After the cap layer is removed, a semiconductor device structure may be formed in the device region.

According to another aspect of the invention, there is provided a semiconductor device comprising a substrate; a device region located on the substrate; and at least one stress introduction region separated from the device region by an isolation structure, with stress introduced into at least a portion of the at least one stress introduction region, wherein the stress introduced into the at least a portion of the at least one stress introduction region is produced by utilizing laser to illuminate an amorphized portion comprised in the at least one stress introduction region to recrystallize the amorphized portion.

According to an embodiment of the invention, the substrate may be a semiconductor substrate, and the device region and the at least one stress introduction region may be formed in the upper part of the semiconductor substrate.

According to another embodiment of the invention, the semiconductor device may further comprise a semiconductor layer formed on the substrate, with the device region and the at least one stress introduction region formed in the semiconductor layer.

According to a further embodiment of the invention, the isolation structure may comprise a dielectric filled in the spacing between the device region and the at least one stress introduction region.

According to a further embodiment of the invention, the device region may comprise a semiconductor device structure formed therein.

BRIEF DESCRIPTION OF THE DRAWINGS

These and other objects, features and advantages of the invention will become more apparent from the following detailed description of the exemplary embodiments of the invention with reference to the accompanying drawings. In the drawings.

DETAILED DESCRIPTION OF THE INVENTION

Figure 1:
FIG. 1 shows the first step of a method for manufacturing a semiconductor device according to an exemplary embodiment of the invention, in which a substrate is provided.

Exemplary embodiments of the invention will be described in detail with reference to the accompanying drawings hereinafter. The drawings are schematic and not drawn to scale, and just for illustrating the embodiments of the invention and are not intended to limit the protective scope of the invention. In the drawings, like reference numerals denote identical or similar components. For making the technical solution of the invention clearer, process steps and device structures known in the art are omitted herein.

Firstly, a method for manufacturing a semiconductor device according to an exemplary embodiment of the invention will be described in detail with reference to FIGS. 1-6.

FIG. 1 shows a first step of a method for manufacturing a semiconductor device according to an exemplary embodiment of the invention. In this step, a substrate 101 is provided. The substrate 101 may be formed from a semiconductor material. For example, the substrate 101 may comprise, but not limited to, a material or a combination of materials selected from a group made up of the following materials: silicon, silicon germanium, silicon carbide, etc. The substrate 101 may also be made from other materials. For example, the substrate 101 may comprise, but not limited to, a material or a combination of materials selected from a group made up of the following materials: sapphire, glass, organic material. The substrate 101 may also be formed by stacking a plurality of layers as desired. For example, the substrate 101 may comprise an insulating layer and a semiconductor layer located on the insulating layer, thereby forming a so-called SOI substrate.

Figure 2A:
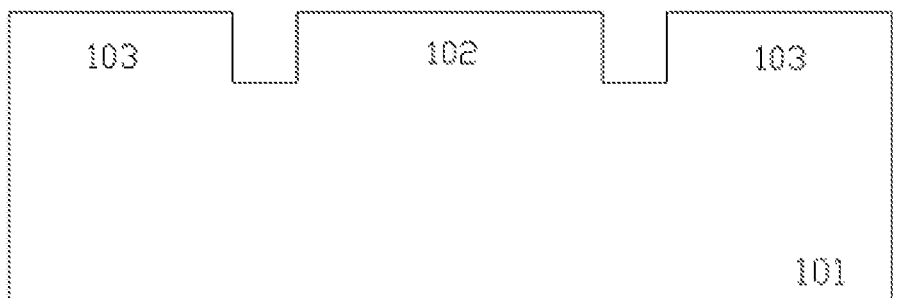
FIGS. 2A and 2B show the second step of the method for manufacturing a semiconductor device according to an exemplary embodiment of the invention, in which a device region is formed and at least one stress introduction region separated from the device region is formed on the substrate.
Figure 2B:
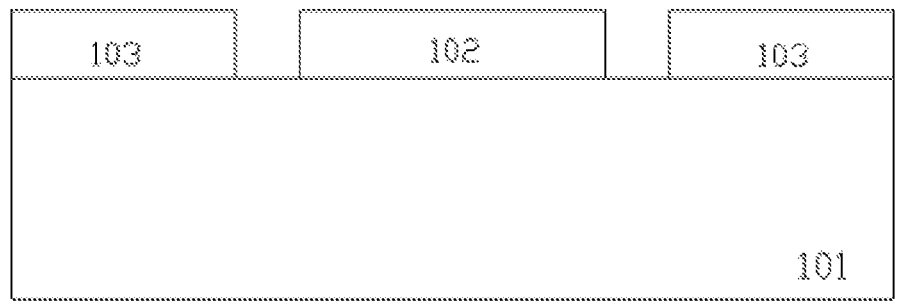

FIGS. 2A and 2B show the second step of the method for manufacturing a semiconductor device according to an exemplary embodiment of the invention. In this step, a device region 102 is formed and at least one stress introduction region 103 separated from the device region 102 is formed on the substrate 101. The device region 102 is a region for forming a semiconductor device structure, which semiconductor device structure may be a transistor, MEMs device, etc. The number of the stress introduction region 103 to be formed may be selected as desired or according to a particular application. Only one stress introduction region may be formed, and also multiple stress introduction regions may be formed.

In an example, the substrate 101 may be a semiconductor substrate. In this case, at least a portion of the upper part of the semiconductor substrate 101 may be amorphized, thereby forming the device region 102 and the at least one stress introduction region 103 separated from the device region 102, as shown in FIG. 2A.

In another example, a semiconductor layer may first be formed on the substrate 101 and then at least a portion of the semiconductor layer is patterned, thereby forming the device region 102 and the at least one stress introduction region 103 separated from the device region 102, as shown in FIG. 2B.

It is to be noted that, while the device region and the stress introduction region may be formed at the same time in certain embodiments of the invention, the invention is not limited thereto. Those skilled in the art may select the sequence of formation of the device region and the stress introduction region as desired or according to a particular application. For example, the device region may first be formed, and then the stress introduction region separated from the device region is formed.

As described previously, the device region 102 is a region for forming a desired semiconductor device structure. In a method for manufacturing a semiconductor device according to an exemplary embodiment of the invention, a choice may be made as to when to form a desired semiconductor device structure as desired or according to a particular application. For example, a desired semiconductor device structure such as a transistor may be formed in the device region 102 after the device region 102 is formed on the substrate 101.

Figure 3:
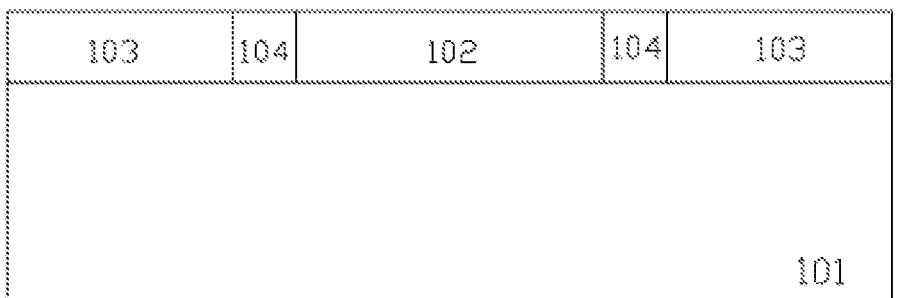
FIG. 3 shows the third step of the method for manufacturing a semiconductor device according to an exemplary embodiment of the invention, in which an isolation structure is formed between the device region and the at least one stress introduction region.

FIG. 3 shows the third step of the method for manufacturing a semiconductor device according to an exemplary embodiment of the invention. In this step, an isolation structure 104 is formed between the device region 102 and the at least one stress introduction region 103.

The isolation structure 104 may be for example a shallow trench isolation (STI) structure. In an example, the isolation structure 104 may be formed by filling the spacing between the device region 102 and the at least one stress introduction region 103 with a dielectric.

Of course, those skilled in the art may also select the type of the isolation structure as desired or according to a particular application. For example, the isolation structure may also be a field oxide.

As described previously, in a method for manufacturing a semiconductor device according to an exemplary embodiment of the invention, a choice may be made as to when to form a desired semiconductor device structure as desired or according to a particular application. In an example, a semiconductor device structure such as a transistor may be formed in the device region 102 after the isolation structure 104 is formed.

It is to be noted that, for the sake of simplicity, an illustration is shown in FIG. 3 taking as an example the situation in which the device region and the stress introduction region are formed by patterning the semiconductor layer formed on the substrate (as shown in FIG. 2B). However, though not shown, the step as shown in FIG. 3 applies equally to the situation in which the upper part of the semiconductor substrate is patterned to form the device region and the stress introduction region (as shown in FIG. 2A). This is also the case for FIGS. 4-6.

Figure 4:
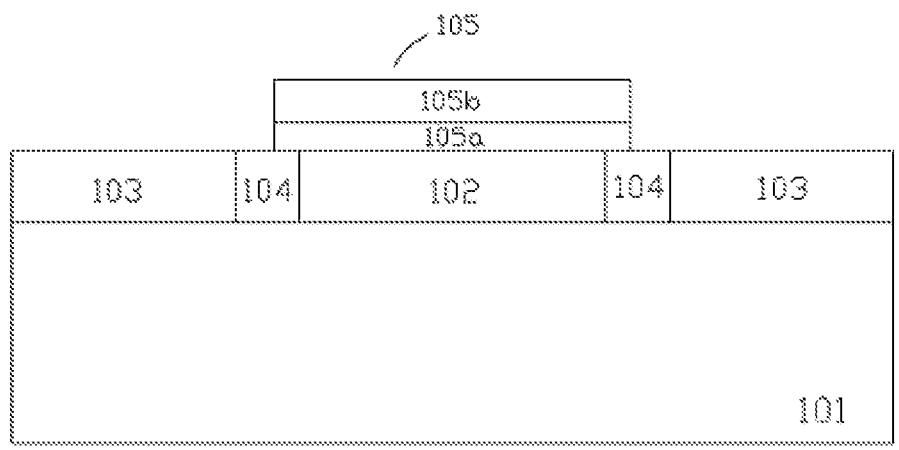
FIG. 4 shows the optional fourth step of the method for manufacturing a semiconductor device according to an exemplary embodiment of the invention, in which a cap layer covering at least the device region is formed.

FIG. 4 shows the optional fourth step of the method for manufacturing a semiconductor device according to an exemplary embodiment of the invention. In this optional step, a cap layer 105 at least covering the device region 102 is formed. The cap layer 105 may be used as a mask for protecting the device region 102 in a subsequent process step to shield the device region 102 from being amorphized or being illuminated by laser.

In an example, the cap layer 105 may comprise a metal layer 105b capable of reflecting laser. The metal layer 105b may comprise, but not limited to, a material or a combination of materials selected from a group made up of the following materials: Al, W, Ti.

In another example, the cap layer 105 may further comprise a buffer layer 105a located below the metal layer 105b. The buffer layer 105a may comprise, but not limited to, a material or a combination of materials selected from a group made up of the following materials: $SiO_2$, $Si_3N_4$.

Figure 5:
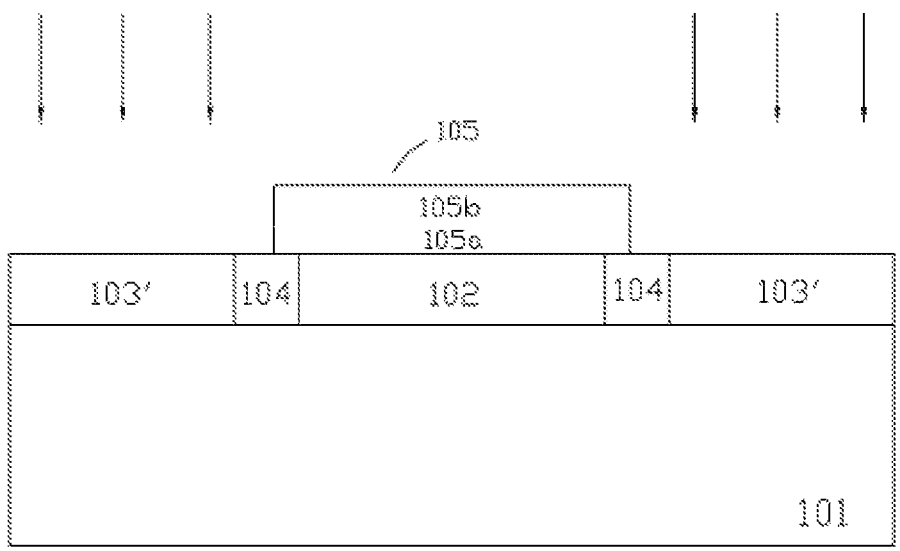
FIG. 5 shows the fifth step of the method for manufacturing a semiconductor device according to an exemplary embodiment of the invention, in which at least a portion of the at least one stress introduction region is amorphized.

FIG. 5 shows the fifth step of the method for manufacturing a semiconductor device according to an exemplary embodiment of the invention. In this step, at least a portion of the at least one stress introduction region 103 is amorphized. In FIG. 5, a reference sign 103' is used to the already amorphized portion of the stress introduction region.

In an example, at least a portion of the at least one stress introduction region 103 may be amorphized by selectively implanting ions into the at least a portion of the at least one stress introduction region (as shown by the arrows in FIG. 5). The injected ions may be Ge or Xe. The energy of the ions may be 50 to 400 KeV. The dosage of injection may for example be larger than $1 \times 10^{14}$ $cm^{-2}$. It is to be noted that, the invention is not limited to the above example, and at least a portion of the at least one stress introduction region may be amorphized by other methods known to those skilled in the art.

As described previously, before the step of amorphizing, the optional step as shown in FIG. 4 may be performed to form a cap layer 105 at least covering the device region 102, which cap layer may be used as a mask to shield the device region 102 from being amorphized. In FIG. 5 the cap layer 105 is also shown. However, it is to be noted that the step for forming a cap layer is not necessary, and the device region may be masked in other ways. For example, before amorphizing, a covering may be disposed directly over the device region and at a distance from the device region, thereby shielding the device region from being amorphized.

While it is shown in FIG. 5 that all the stress introduction regions are amorphized to form amorphized stress introduction regions 103', it is to be noted that the invention is not limited thereto. Those skilled in the art may select the portion of the stress introduction regions needed to be amorphized as desired or according to a particular application. That is to say, at least a portion of the at least stress introduction region may be amorphized by the step of amorphizing of the method for manufacturing a semiconductor device according to an exemplary embodiment of the invention.

Figure 6:
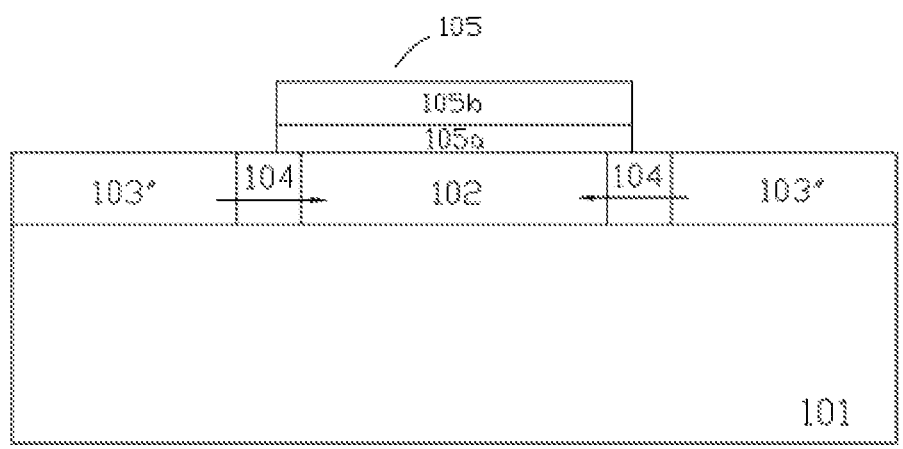
FIG. 6 shows the sixth step of the method for manufacturing a semiconductor device according to an exemplary embodiment of the invention, in which laser is utilized to illuminate the amorphized portion of the at least one stress introduction region to recrystallize the amorphized portion.

FIG. 6 shows the sixth step of the method for manufacturing a semiconductor device according to an exemplary embodiment of the invention. In this step, laser is utilized to illuminate the amorphized portion of the at least one stress introduction region to recrystallize the amorphized portion to form a recrystallized portion 103", thereby introducing stress into the at least one stress introduction region.

In an example, the wavelength of the laser used may for example be in a range of 200 nm to 600 nm. The temperature at which the amorphized portion of the stress introduction region is recrystallized by illumination with laser is for example higher than 1400. However, the invention is not limited thereto. Those skilled in the art may select the wavelength of the laser used and the temperature of recrystallization, etc. as desired or according to a particular application.

As shown by the arrows in FIG. 6, the stress introduced into the stress introduction region may act upon the device region 102, thereby improving the performance of the semiconductor device structure formed in the device region. For example, in the case of the semiconductor device structure formed in the device region being a transistor, the stress introduced into the stress introduction region may act upon a channel of the transistor, thereby increasing the mobility of carriers in the channel to improve the speed of the device.

As described previously, optionally a cap layer 105 at least covering the device region 102 may be formed, which cap layer may be used as a mask to shield the device region 102 from being illuminated by laser. In FIG. 6, the cap layer 105 is also shown. However, it is to be noted that the cap layer is not necessary, and the device region may also be masked in other ways. For example, before illumination with laser, a covering may be disposed directly over the device region and at a distance from the device region, thereby shielding the device region from being illuminated by laser.

In an example in which a cap layer is formed, optionally, the cap layer may be removed after the amorphized portion of the at least one stress introduction region is recrystallized and thereby stress is introduced into the at least one stress introduction region.

As described above, in a method for manufacturing a semiconductor device according to an exemplary embodiment of the invention, a choice may be made as to when to form a desired semiconductor device structure as desired or according to a particular application. In an example, a semiconductor device structure such as a transistor may be formed in the device region after the cap layer is removed or the covering disposed over the device region is removed.

In the method for manufacturing a semiconductor device according to an exemplary embodiment of the invention as shown in FIGS. 1-6, at least a portion of the at least one stress introduction region is amorphized, and laser is utilized to illuminate the amorphized portion of the at least one stress introduction region to recrystallize the amorphized portion, thereby introducing stress into the at least one stress introduction region. Thus, the invention proposes a technique of producing stress by utilizing laser to achieve a selective recrystallization. As compared to the prior art, such a technique is simpler and can be widely used in the fabrication of various integrated circuits.

In the following, a semiconductor device according to an exemplary embodiment of the invention will be described in detail with respect to FIG. 7.

Figure 7:
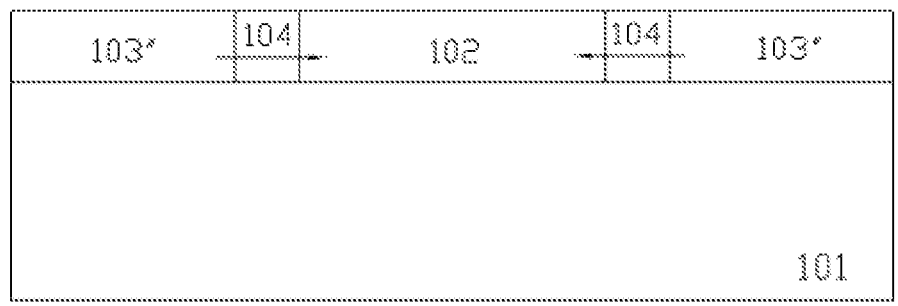
FIG. 7 shows a schematic cross section view of a semiconductor device according to an exemplary embodiment of the invention.

FIG. 7 shows a schematic cross section view of a semiconductor device according to an exemplary embodiment of the invention. The semiconductor device may for example be formed by the method for manufacturing a semiconductor device according to an exemplary embodiment of the invention as shown in FIGS. 1-6.

As shown in FIG. 7, the semiconductor device according to an exemplary embodiment of the invention may comprise: a substrate 101; a device region 102 located on the substrate 101; and at least one stress introduction region 103" separated from the device region 102 by an isolation structure 104, with stress introduced into at least a portion of the at least one stress introduction region. Therein the stress introduced into the at least a portion of the at least one stress introduction region is produced by utilizing laser to illuminate a amorphized portion comprised in the at least one stress introduction region to recrystallize the amorphized portion.

The device region 102 may for example comprise a semiconductor device structure formed therein. The semiconductor device structure may for example be a transistor, MEMs device, etc.

The isolation structure may for example be a shallow trench isolation (STI) structure. In an example, the isolation structure comprises a dielectric filled in the spacing between the device region 102 and the at least one stress introduction region 103". Of course, those skilled in the art may also select the type of the isolation structure as desired or according to a particular application. For example, the isolation structure may also be a field oxide.

As shown by the arrows in FIG. 7, the stress introduced into the stress introduction region may act upon the device region 102, thereby improving the performance of the semiconductor device structure formed in the device region. For example, in the case of the semiconductor device structure formed in the device region being a transistor, the stress introduced into the stress introduction region may act upon a channel of the transistor, thereby increasing the mobility of carriers in the channel to improve the speed of the device.

In an example, the substrate 101 may be a semiconductor substrate, and the device region 102 and the at least one stress introduction region 103" are formed in the upper part of the semiconductor substrate.

In another example, the semiconductor device may further comprise a semiconductor layer formed on the substrate 101, with the device region 102 and the at least one stress introduction region 103" formed in the semiconductor layer, as shown in FIG. 7.

While the exemplary embodiments of the invention have been described in detail with reference to the drawings, such a description is to be considered illustrative or exemplary and not restrictive; the invention is not limited to the disclosed embodiments. Various embodiments described in the above and the claims may also be combined. Other variations to the disclosed embodiments can be understood and effected by those skilled in the art in practicing the claimed invention, from a study of the drawings, the disclosure, and the appended claims, which variations also fall within the protective scope of the invention.

In the claims, the word "comprising" does not exclude the presence of other elements or steps, and "a" or "an" does not exclude a plurality. The mere fact that certain measures are recited in mutually different dependent claims does not indicate that a combination of these measures cannot be used to advantage.

What is claimed is:

1. A method for manufacturing a semiconductor device, comprising:

providing a substrate;

forming a device region and forming at least one stress introduction region separated from the device region on the substrate;

forming an isolation structure between the device region and the at least one stress introduction region;

forming a cap layer at least covering the device region;

amorphizing at least a portion of the at least one stress introduction region;

recrystallizing the amorphized portion of the at least one stress introduction region by laser, thereby introducing stress into the at least one stress introduction region; and removing the cap layer.

2. The method for manufacturing a semiconductor device as claimed in claim 1, wherein the substrate is a semiconductor substrate, and wherein forming a device region and forming at least one stress introduction region separated from the device region on the substrate comprises: patterning at least a portion of the upper part of the semiconductor substrate, thereby forming the device region and the at least one stress introduction region separated from the device region.

3. The method for manufacturing a semiconductor device as claimed in claim 1, wherein forming a device region and forming at least one stress introduction region separated from the device region on the substrate comprises:

forming a semiconductor layer on the substrate; and patterning at least a portion of the semiconductor layer, thereby forming the device region and the at least one stress introduction region separated from the device region.

4. The method for manufacturing a semiconductor device as claimed in claim 1, wherein forming an isolation structure between the device region and the at least one stress introduction region comprises: filling the spacing between the device region and the at least one stress introduction region with a dielectric.

5. The method for manufacturing a semiconductor device as claimed in claim 1, wherein at least a portion of the at least one stress introduction region is amorphized by selectively implanting ions into the at least a portion of the at least one stress introduction region.

6. The method for manufacturing a semiconductor device as claimed in claim 1, wherein the cap layer comprises a metal layer capable of reflecting laser.

7. The method for manufacturing a semiconductor device as claimed in claim 6, wherein the cap layer also comprise a buffer layer below the metal layer.

8. The method for manufacturing a semiconductor device as claimed in claim 1, further comprising forming a semiconductor device structure in the device region after the device region is formed in the substrate.

9. The method for manufacturing a semiconductor device as claimed in claim 1, further comprising forming a semiconductor device structure in the device region after the isolation structure is formed between the device region and the at least one stress introduction region.

10. The method for manufacturing a semiconductor device as claimed in claim 1, further comprising forming a semiconductor device structure in the device region after the cap layer is removed.

* * * * *